United States Patent [19]
Law

[11] Patent Number: 6,040,790
[45] Date of Patent: Mar. 21, 2000

[54] METHOD OF BUILDING AN ADAPTIVE HUFFMAN CODEWORD TREE

[75] Inventor: Simon M. Law, Torrance, Calif.

[73] Assignee: Xerox Corporation, Stamford, Conn.

[21] Appl. No.: 09/087,389

[22] Filed: May 29, 1998

[51] Int. Cl.[7] .................................................. H03M 7/40
[52] U.S. Cl. ............................................. 341/65; 341/67
[58] Field of Search ................................ 341/65, 67, 79, 341/51, 106

[56] References Cited

U.S. PATENT DOCUMENTS

| | | | |
|---|---|---|---|
| 5,432,512 | 7/1995 | Park | 341/67 |
| 5,696,507 | 12/1997 | Nam | 341/67 |

*Primary Examiner*—Brian Young
*Attorney, Agent, or Firm*—Robert Cunha

[57] ABSTRACT

Many compression algorithms require the compressor to generate trees (tables) for encoding purposes. To generate the optimum tree for a set of Huffman symbols either takes too much time or requires too much hardware. This invention proposes to separate the symbols into groups according to the symbol's occurring frequency. With these groups of symbols available, subsequent code length assignment of these groups can be done without a complete sorting of all the symbols and their parents. During code length assignment, some relocation of individual symbols from one group to another can also be performed to optimize the Huffman table. In most of the cases this technique can achieve a compression ratio within 5% of the optimum Huffman table, while requiring less hardware or software overhead.

4 Claims, 2 Drawing Sheets

6,040,790

METHOD OF BUILDING AN ADAPTIVE HUFFMAN CODEWORD TREE

BACKGROUND OF THE INVENTION

Building an adaptive Huffman codeword tree by analyzing the symbols in a document to be compressed to determine their frequency, grouping the frequencies into bands and assigning, to all of the symbols in each band, codewords having the same number of bits.

Huffman coding is a system of compression where symbols used most frequently are assigned codewords having the smallest number of bits, where symbols can be sets of characters, words, bytes or the like. Thus, to use words in a document as an example, a commonly used long word will be assigned a codeword having a smaller number of bits than a less frequently used short word.

To make a permanent table for the compression of text documents, for example, a typical sampling of text is analyzed, the frequency of each word is determined, and a permanent table is constructed where the most frequently used words in the sampling are assigned the shortest code words.

An improvement is to make the system "adaptive" by tailoring the specific set of codewords to the specific document being transmitted. In other words, assign codewords, not to the words that are used in a typical sampling, but to the words that are actually used in the particular document. In this case the compressor builds a table that is optimized for the document, and also sends the code table to the decompressor to decode it. In this way, words not found in the actual document need not be assigned a codeword.

The Huffman encoding process has two general steps. The first is to form groups of symbols based on frequency of use, and assign each group to a corresponding group of codewords which have the same number of bits, the result being the building of a Huffman tree. At this point there may be any number of groups. However, the industry standard is for there to be no more than 15 bits in the largest set of codewords, and, of course, for there to be no more symbols in each group than there is capacity for. If either of these limits is exceeded, then the second step is to adjust the symbols down into the smaller codewords, where space is available, to reduce the size of the largest codeword and to reduce any overflow in a single group.

This type of Huffman coding is used in GZIP shareware which is an industry standard, and is described in The Data Compression Book by Mark Nelson and Jean-Loup Gailly and also in the GZIP software code and comments.

One problem with the Huffman encoding process is its complexity which results in costly hardware and time consuming processing.

SUMMARY OF THE INVENTION

The grouping of symbols into an adaptive Huffman tree can be simplified by first analyzing the data to determine the frequency of each symbol, where a symbol can be any number of bits. For this discussion, a symbol will be an 8-bit byte. The frequency of a symbol will be the number of times the symbol is used, divided by the total number of symbols. Thus, if a symbol is used 10 times, the frequency is 10. The frequency is then normalized to a maximum frequency. In this numerical example let us assume that the symbol that was used most often appeared in the data stream 500 times, and the frequency has to be normalized to 32768. Then, the frequency, 10, is multiplied by 32768/500 to equal 655. The next step is to assign symbols having normalized frequencies to frequency bands. Continuing the numerical example, all symbols having normalized frequencies of between 512 and 1023 are in the same band, and are assigned codeword having the same number of bits. Bands of higher frequencies are assigned shorter codewords, and lower frequencies are assigned longer codewords. The result is that a slightly less than optimum Huffman tree can be created using a simplified circuit and reduced processing overhead.

DETAILED DESCRIPTION OF THE INVENTION

Figure 1:
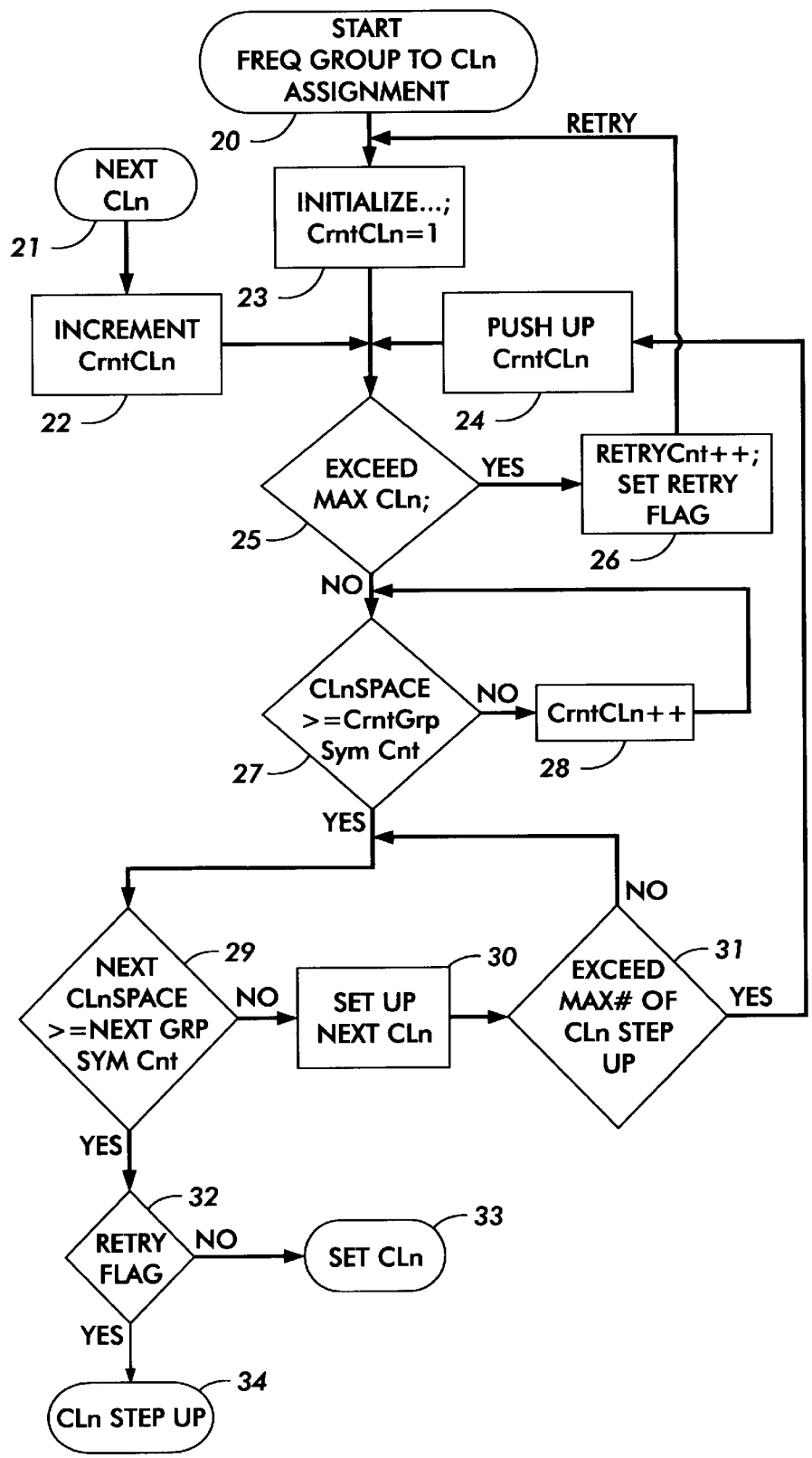
FIG. 1 is a flowchart of the process.
Figure 2:
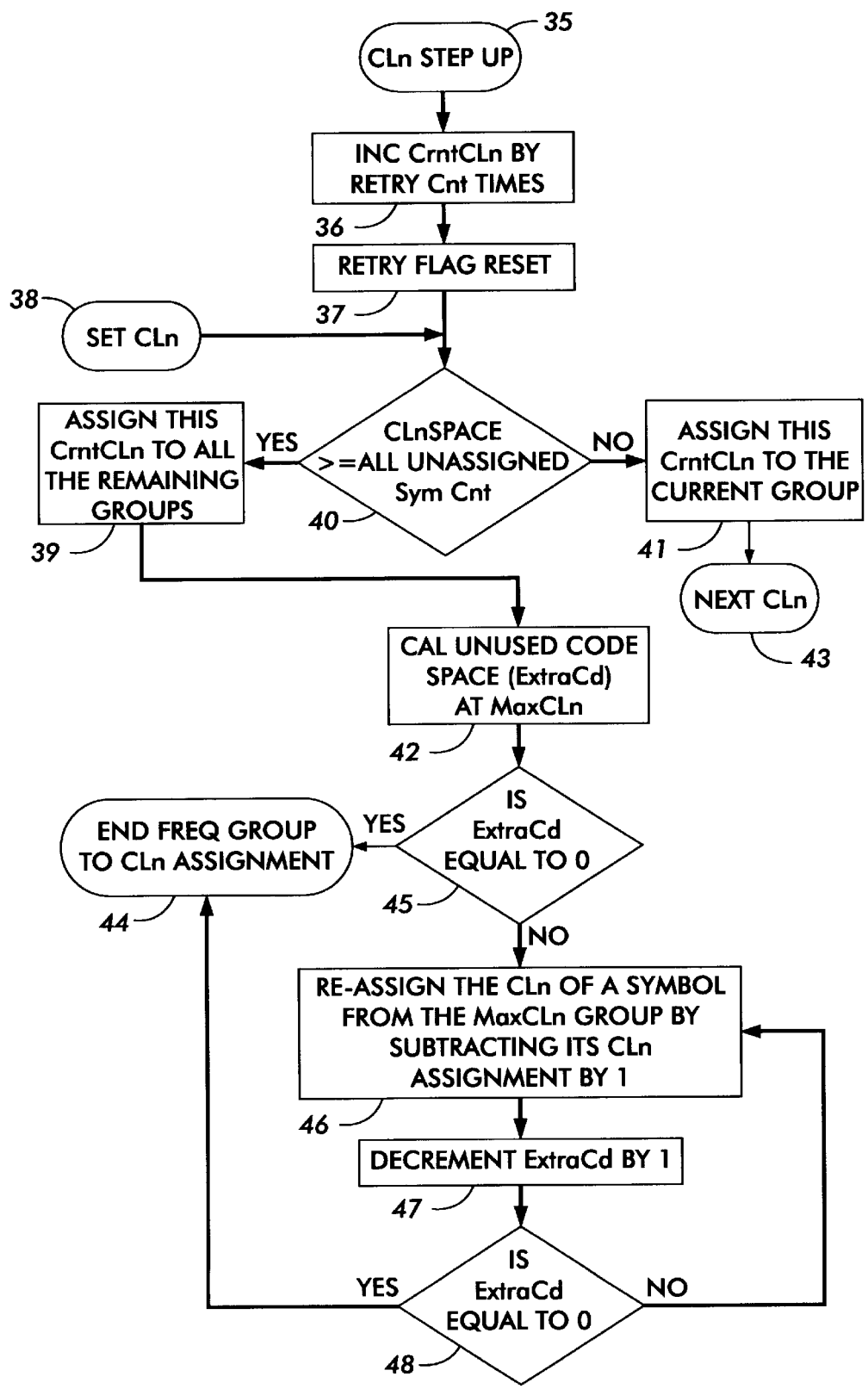
FIG. 2 is a continuation of the flowchart of FIG. 1

Many compression algorithms require the compressor to generate Huffman trees (tables) for encoding purposes. To generate the optimum Huffman tree for a set of Huffman symbols, the symbols must be sorted on their occurring frequency. In addition to the initial sorting, a number of nodes will be generated. Each node is sorted together with a number of symbols during the processing to form a Huffman tree in which symbols having the same number of bits in their codeword are grouped together in the same node. Using hardware to sort and build such a Huffman table for a large number of symbols, over 200, is either too slow or requires too much hardware.

A simpler method is to group the symbols according to their frequencies. The table below is a graphical view of one way to group a set of symbols. The frequency of each symbol is scaled, normalized, by using the following equation:

Normal Frequency=Frequency×32768/Maximum Frequency

The table shows that the difference from one group to another is a factor of 2.

This factor can be modified to fit different types of files that are going to be Huffman encoded. Also, this ratio can be different from group to group. For example, the higher frequency groups can have a factor smaller or larger than the lower frequency groups.

The hardware for this grouping function is much simpler than that needed for sorting all the symbols if the total symbol count is in the order of 200. After grouping, there will be a number of frequency groups. In the case shown in the table, the number of groups can be as small as 1 and the maximum number of groups can equal 15, which is the industry standard. In the example shown, the number of groups shown is the maximum number allowable. Next, a code length is assigned to each group.

Codewords are assigned to groups according to the following process. Assume a first codeword (for example, 11010) for the first symbol in a frequency band (the band having five bits). Then the codeword for the symbol having the next higher frequency would be adding having a 1, to generate 11011. This process would continue until the last symbol in the group. To go to the next group, 1 is added to the number (11100) and a zero is added to the end(111000) to create the first codeword of the next band, and the process is continued as before.

A simple code assignment example of a code tree is shown below. Assume the following symbol count for each code length group is obtained after symbol grouping.

| Code Length Group | Symbol Count |
|---|---|
| 1 | 0 |
| 2 | 2 |
| 3 | 0 |
| 4 | 5 |
| 5 | 2 |
| 6 | 7 |
| 7 | 2 |
| 8 | 0 |
| 9 | 0 |
| etc. | |

The code assignment for each symbol becomes.

| Code Length | Code |
|---|---|
| 2 | 00 |
| 2 | 01 |
| 4 | 1000 |
| 4 | 1001 |
| 4 | 1010 |
| 4 | 1011 |
| 4 | 1100 |
| 5 | 11010 |
| 5 | 11011 |
| 6 | 111000 |
| 6 | 111001 |
| 6 | 111010 |
| 6 | 111011 |
| 6 | 111100 |
| 6 | 111101 |
| 6 | 111110 |
| 7 | 1111110 |
| 7 | 1111111 |

Here 18 are arranged into code words of up to 7 bits in length. Normally, the most common symbol is assigned a one bit code word, namely "0". However, in this example, there were two most frequent symbols of the same frequency which would not fit in the first group of one, so they both are assigned to the second group. The total number of symbols is small so only the first 7 groups were needed in this case.

A code tree for 200 symbols or more, built by this basic process, may have several problems. There may be more items than can fit in one class, the largest code word may have more than 15 bits or the resultant code word tree may require optimization. The complete process, which takes these complications into consideration, is shown as FIG. 1.

On the first pass the current (Crnt) code (Cd) length (Cln) number is set to 1 at step 23 and then the loop starts at step 25 which tests to see if the code length number exceeds the maximum code length of 15. Normally this test is passed and at step 27, the test is whether the space in the group (Grp) is large enough for the number of remaining symbols in the group. If not, the code length is increased by one to double its capacity at step 28 and the test 27 is repeated. When the space is large enough for the group of symbols, at step 29 the next group is tested to see if it is also large enough for its symbol (Sym) count (Cnt), assume yes. This is not a retry so proceed to step 40. Here the question is whether all subsequent symbols in the table will fit into the current group space. As a matter of optimum compression, if all subsequent symbols will fit into the current group, then all of them will be put there, thus eliminating the requirement of using any larger code words. A "yes" at test 40 will result in step 39, assigning the remaining symbols to the current group.

An indication that the tree is close to optimum is that the last code word is all ONE's. If it is not, then the compression can be improved by transferring one symbol to the previous group. This test is shown at step 42 where the unused space in the last group is calculated (Cal), and step 45 where the unused capacity is compared to 0. If there is space, then, step 46, one symbol is transferred to the previous group, the number of codes to be transferred is decreased by one, step 47 and the result is tested again at step 48. If all of the codes are not transferred, the process will loop through step 46 until there is no unused space in the last group, which ends the process at step 44.

If, at step 40, there are more remaining symbols that can fit in the current group, the process assigns the current code length to the current group at step 41 and proceeds through steps 43 and 21 to step 22 where the code length is incremented and step 25 is repeated.

At step 29, the next group is tested to see if its set of symbols will fit. If not, at step 30, the next codelength space is increased to avoid problems on the next cycle, and the loop through test 29 is repeated. If, at step 31, the number of step up's exceeds a predetermined number, such as 2, then at step 24 the current code length is increased at step 24 to decrease the number of subsequent steps ups that will be necessary.

If, at step 25, the maximum code length of 15 is exceeded, the retry counter is incremented, the retry flag is set and the process starts all over again from the beginning at step 23. This time when the process gets to step 32, the process branches to step 36 where the first current code length is increased by the retry count, and the retry flag is reset at step 37. If, at the end of this process, the maximum code length is still greater than 15, the retry counter is again incremented. Ultimately, the space in the lower groups will be increased by this iterative process to the point where the entire set of symbols will fit into 15 groups.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A method of building an adaptive Huffman codeword tree for input symbols comprising the steps of:

a) creating a number of bands to continuously cover all frequencies of use from least to most used symbols, b) assigning a number of codeword bits to each band, lower numbers being assigned to higher frequencies, c) assembling all symbols into a list in order of frequency of use, and assigning each symbol to a group so that the frequency of each symbol falls within the band of the group, d) if there is enough space in a current group for all symbols assigned to the group, assign to each symbol a current codeword, and increment the codeword for each symbol, f) if there is enough space in the current group for all of the remaining symbols, assign to each remaining symbol a current codeword and increment the codeword, and g) if the current symbol is the last symbol of a group, increment the codeword, add a zero to the end of the codeword to start a new group, and go back to step d).

2. The method of claim 1 wherein h) if the last codeword is not all ONE's, transfer a symbol of the last group to the previous group.

3. The method of claim 1 wherein e) if there is not enough space in a current group for all symbols assigned to the group, add a zero to the codeword to start a new group, and go back to step d).

4. The method of claim 1 wherein, before step d), set the initial codeword to one bit, and i) if the number of bits in the code word is greater than 15, increment the initial codeword and return to step d).

* * * * *